(12) United States Patent
Figueroa et al.

(10) Patent No.: US 6,680,526 B2
(45) Date of Patent: Jan. 20, 2004

(54) SOCKET WITH LOW INDUCTANCE SIDE CONTACTS FOR A MICROELECTRONIC DEVICE PACKAGE

(75) Inventors: David G. Figueroa, Mesa, AZ (US); Yuan-Liang Li, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/125,000

(22) Filed: Apr. 17, 2002

(65) Prior Publication Data

US 2003/0197259 A1 Oct. 23, 2003

(51) Int. Cl.⁷ .............................................. H01L 23/48
(52) U.S. Cl. ..................... 257/693; 257/773; 257/727
(58) Field of Search ................................ 257/693, 692, 257/698, 773, 726, 727; 438/117; 361/802, 803, 785, 787, 788; 439/68, 69, 70, 71, 72

(56) References Cited

U.S. PATENT DOCUMENTS

| | | | |
|---|---|---|---|
| 5,400,220 A | * | 3/1995 | Swamy |
| 5,751,553 A | * | 5/1998 | Clayton et al. |
| 6,390,827 B1 | * | 5/2002 | Howell et al. |

* cited by examiner

*Primary Examiner*—Sheila V. Clark
(74) *Attorney, Agent, or Firm*—Blakely, Sokoloff, Taylor & Zafman LLP (57) ABSTRACT

A socket coupled to a circuit board to receive a package of microelectronic device has one or more electrical contacts coupled to its outer surfaces. Each contact provides a low inductance shunt connection from the side of the package to the circuit board. The contact includes multiple adjacent, electrically conductive members, each including a rigid portion and a flexible portion projecting from the rigid portion. The flexible portion is positioned to be in physical contact with a corresponding electrical conductor on an outer surface of the package when the package is coupled to the socket. At least one adjacent pair of the electrically conductive members conduct current in opposite directions to provide mutual inductance. The contact further includes a dielectric layer sandwiched between each two adjacent rigid portions of the conductive members.

26 Claims, 7 Drawing Sheets

SOCKET WITH LOW INDUCTANCE SIDE CONTACTS FOR A MICROELECTRONIC DEVICE PACKAGE

FIELD OF THE INVENTION

Embodiments of the present invention pertain to sockets with contacts that connect to a microelectronic device package, and more particularly, to a socket with low inductance side contacts.

BACKGROUND

In microelectronic device manufacturing, a microelectronic device is formed on a semiconductor chip, or "die". The die is commonly mounted to a "package", which serves to protect the die and may also provide a standardized interface between the die and the printed circuit board (PCB) on which it will be used. The package, with the die mounted on it, is often coupled to the PCB by a socket mounted on the PCB.

An important issue associated with microelectronic systems is high-current power delivery for high speed products. With existing technology, the ability to provide high currents and low inductance for high speed products generally is accomplished by increasing the pin count, i.e., the number of electrical contacts of the microelectronic device. The term "pin" is used herein for convenience to refer to any type of electrical contact of a microelectronic device, such as a pin, solder ball, etc. High pin counts unfortunately tend to increase cost, since cost is related to the number of pins, socket size, and package size, among other factors. Also, with package sizes being driven smaller and smaller, such as for mobile applications, it is becoming increasingly more important to reduce (or at least not to unnecessarily increase) pin counts.

Figure 1A:
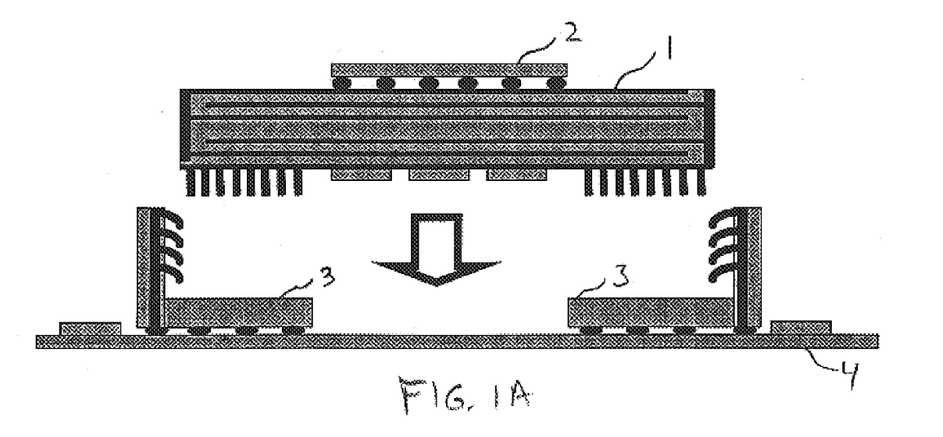
FIGS. 1A and 1B are cross-sectional views illustrating an example of how a package with a die can be connected to a socket on a circuit board.
Figure 1B:
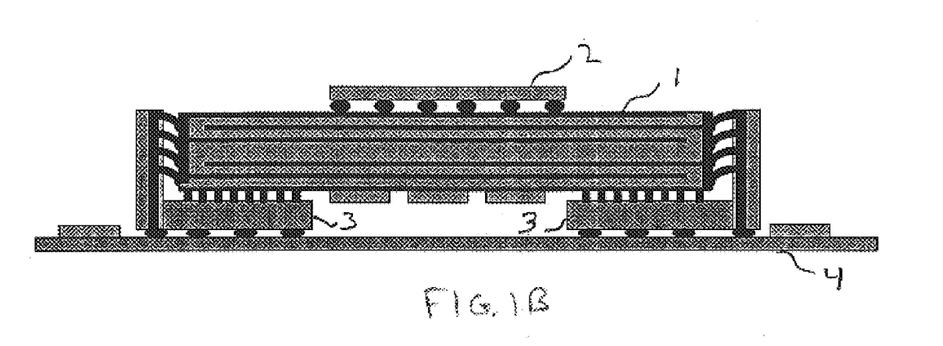

FIGS. 1A and 1B show in cross-section an example of how a package 1, to which a microelectronic die 2 is mounted, can be connected to a socket 3 on a circuit board (e.g., a PCB) 4. The illustrated configuration provides a low resistance connection to shunt power from the side of the package 1 to the circuit board 4. However, with this configuration, a large number of pins are still required to maintain a low inductance connection. Hence, it is possible to deliver higher current, but power for higher speed products still requires the same number of pins.

Another issue associated with high speed products is the signal-to-reference ratio. The signal-to-reference ratio is the ratio of the number of signal pins to the number of reference pins of the device. Generally, in high speed applications it is desirable to maintain a low signal-to-reference ratio. A low signal-to-reference ratio tends to limit routability, but high signal-to-reference ratios of high speed signals tend to cause poor signal integrity. To design a socket for higher speeds, therefore, requires a low signal-to reference ratio. However, with existing technology, lowering the signal-to reference ratio normally requires increasing the pin count to provide more reference pins. The disadvantages of higher pin counts are noted above.

BRIEF DESCRIPTION OF THE DRAWINGS

The present invention is illustrated by way of example and not limitation in the figures of the accompanying drawings, in which like references indicate similar elements and in which.

DETAILED DESCRIPTION

A socket with low inductance side contacts is described. Note that in this description, references to "one embodiment" or "an embodiment" mean that the feature being referred to is included in at least one embodiment of the present invention. Further, separate references to "one embodiment" or "an embodiment" in this description do not necessarily refer to the same embodiment; however, such embodiments are also not mutually exclusive unless so stated, and except as will be readily apparent to those skilled in the art from the description. For example, a feature, structure, act, etc. described in one embodiment may also be included in other embodiments. Thus, the present invention can include a variety of combinations and/or integrations of the embodiments described herein.

As described in greater detail below, a socket coupled to a circuit board to receive a package of microelectronic device has one or more electrical contacts, referred to as "side contacts", coupled to its outer surfaces. Each side contact provides a low inductance direct current (DC) shunt connection from the side of the package to the circuit board. A side contact assembly includes multiple adjacent, electrically conductive members, each including a rigid portion and a flexible portion projecting from the rigid portion. The flexible portion is positioned to be in physical contact with a corresponding electrical conductor on an outer surface of the package when the package is coupled to the socket, to shunt current outside the package between the microelectronic device and the circuit board. The contact further includes a dielectric layer sandwiched between the rigid portions of each two adjacent conductive members.

In certain embodiments, at least one adjacent pair of the electrically conductive members conduct current in opposite directions to provide mutual inductance, lowering the overall inductance. The side contact assembly may also include or provide for a reference plane, which is advantageous for high-speed signals. For differential signals, the reference plane provides improved signal integrity from the edge of the package to the circuit board.

The DC shunt provided by such a side contact allows high current to be shunted outside the package, keeping the DC away from the center of the package. Note that with the configuration of FIGS. 1A and 1B, the area under the package is reserved for connections to the socket, including extra pins used for lowering inductance as well as pins for input/output (I/O). In contrast, use of a side contact assembly as described herein will allow reduction of the pin count used for improving inductance, thereby reducing or avoiding unnecessarily increasing the overall pin count.

Figure 2:
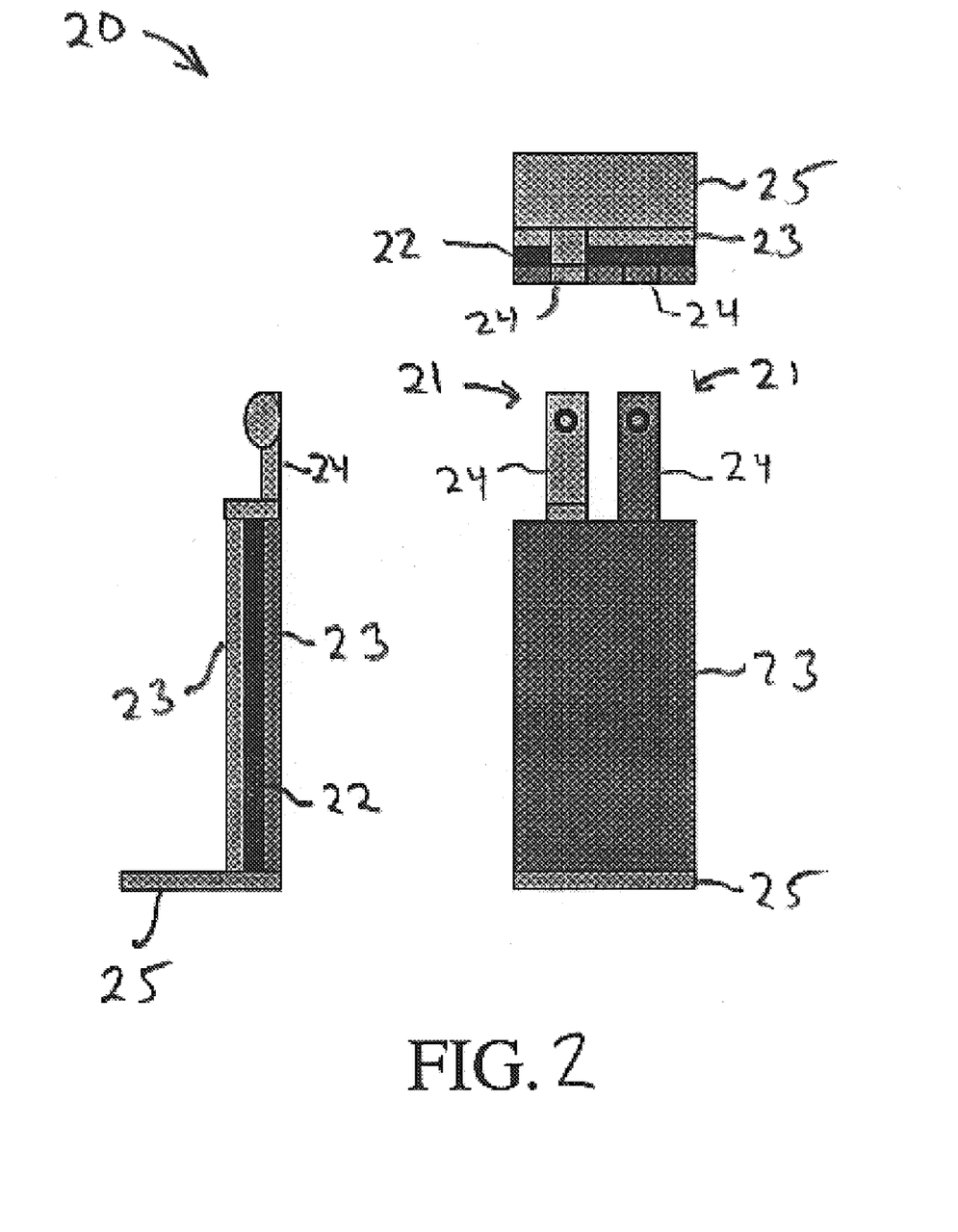
FIG. 2 shows three orthogonal views of a low inductance side contact assembly.

FIG. 2 shows three orthogonal views of a low inductance side contact assembly 20 according to an embodiment of the invention. The side contact assembly 20 can be coupled to the outside of a socket (not shown), such that the side contacts mate with corresponding contacts on the side of the package (not shown) when the package is coupled to the socket. The illustrated embodiment provides two separate electrical connections to a package, where one connection may be used for power and the other for ground. To provide lower overall inductance, the two connections may carry current in opposite directions, which increases the mutual inductance between the two connections.

The two connections of the illustrated side contact assembly 20 are embodied as two electrically conductive members (contacts) 21, with a dielectric layer 22 being sandwiched between them. Optionally, the contact also includes a reference plane 25, which is advantageous particularly in high-speed I/O applications. The conductive members 21 and reference plane 25 can be made from any conductive material conventionally used to make electrical contacts in microelectronic applications, such as copper, tin, aluminum, or an alloy. The dielectric layer may also be any standard dielectric material, such as polyimide, FR4 or FR5.

Each of the conductive members 21 includes a rigid portion 23 and a narrower flexible portion 24 protruding from the rigid portion 23. The rigid portion 23 and flexible portion 24 of a particular conductive number 21 may be formed from a single piece of conductive material, although that is not necessarily so. The terms "rigid" and "flexible" are used herein only in a relative sense; that is, "rigid" is used to mean more rigid than the flexible portion 24, and "flexible" is used to mean more flexible than the rigid portion 23. The rigidity of each rigid portion 23 is mostly due to the "sandwiching" of the dielectric layer 22 between the rigid portions 23. The flexibility of each flexible portion 24 is mostly due to the absence of dielectric layer 22 against it. The flexible portion 24 only needs to be flexible enough to provide a small amount of spring, in order to ensure physical contact is maintained with a matching contact on the side of the package when the package is inserted into the socket. In other embodiments, however, it is not necessary that a portion of the conductive members be flexible if physical contact with the contact on the package is ensured in some other way.

Figure 3:
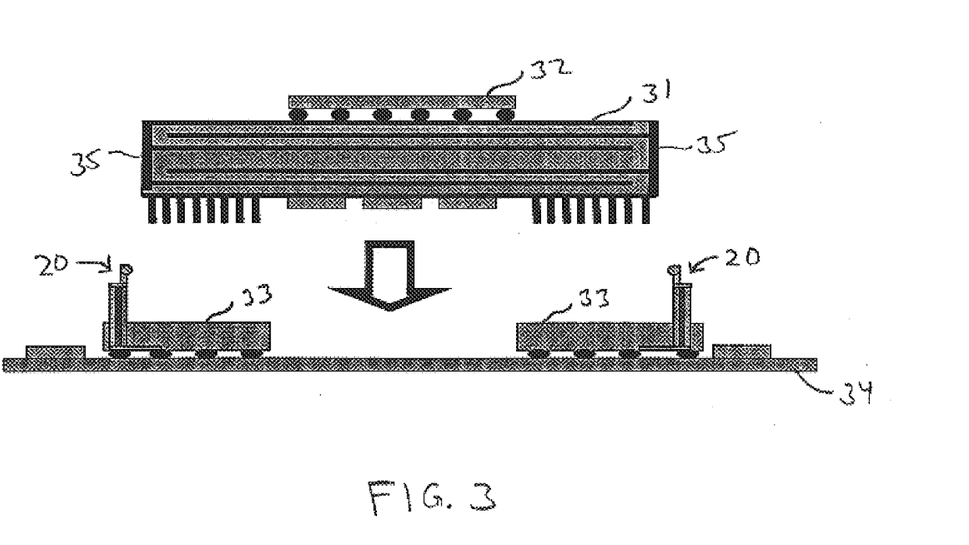
FIG. 3 is a cross-sectional view illustrating connection of a package with integrated die to a socket with low-inductance sides contacts.
Figure 4A:
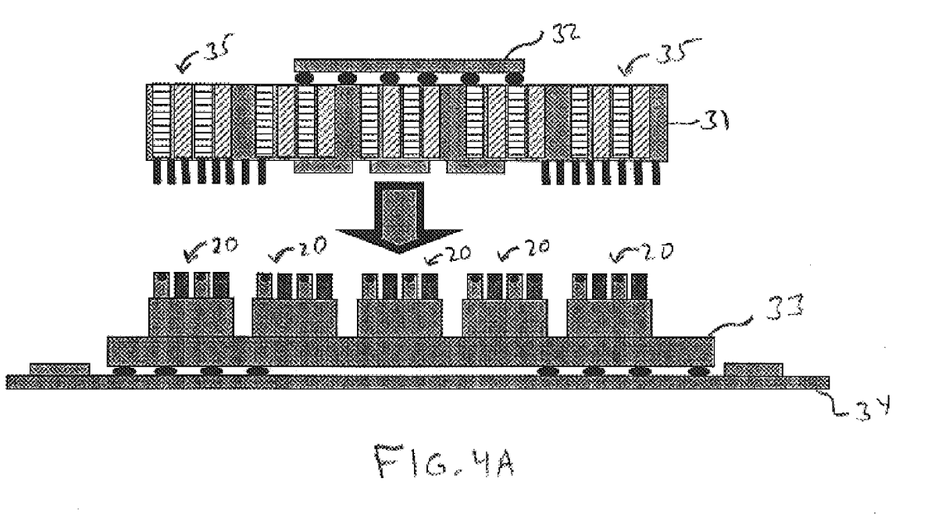
FIGS. 4A and 4B are side views illustrating connection of a package with integrated die to a socket with low-inductance sides contacts.
Figure 4B:
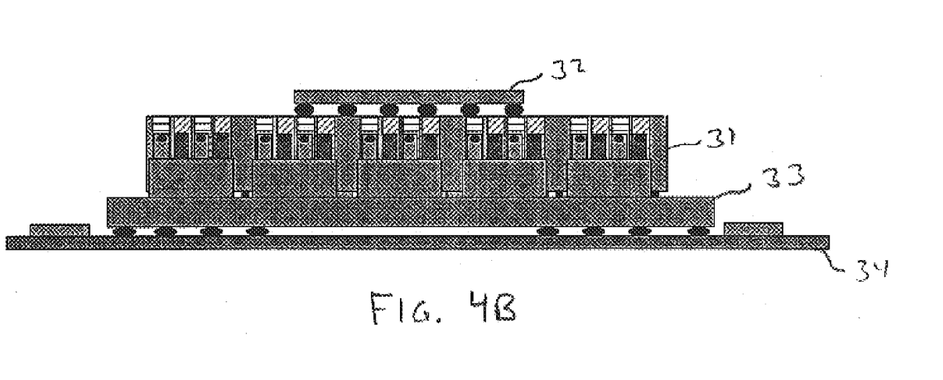

FIG. 3 is a cross-sectional view illustrating the manner of connecting a package 31, to which a microelectronic die 32 is mounted, to a socket 33 to which two or more of the low-inductance side contact assemblies 20 are mounted, on a circuit board 34. The side contact assemblies 20 are mounted to the outer surfaces of the socket 33. The conductive members of the side contact assemblies make contact with corresponding conductors 35 on the side of the package 31. FIGS. 4A and 4B are side views (non-cross-sectional) corresponding to FIG. 3, illustrating the manner of connecting the package 31 to the socket 33 with low-inductance sides contact assemblies 20. In FIGS. 4A and 4B, there are four side contact assemblies shown, each having four contacts.

Figure 5:
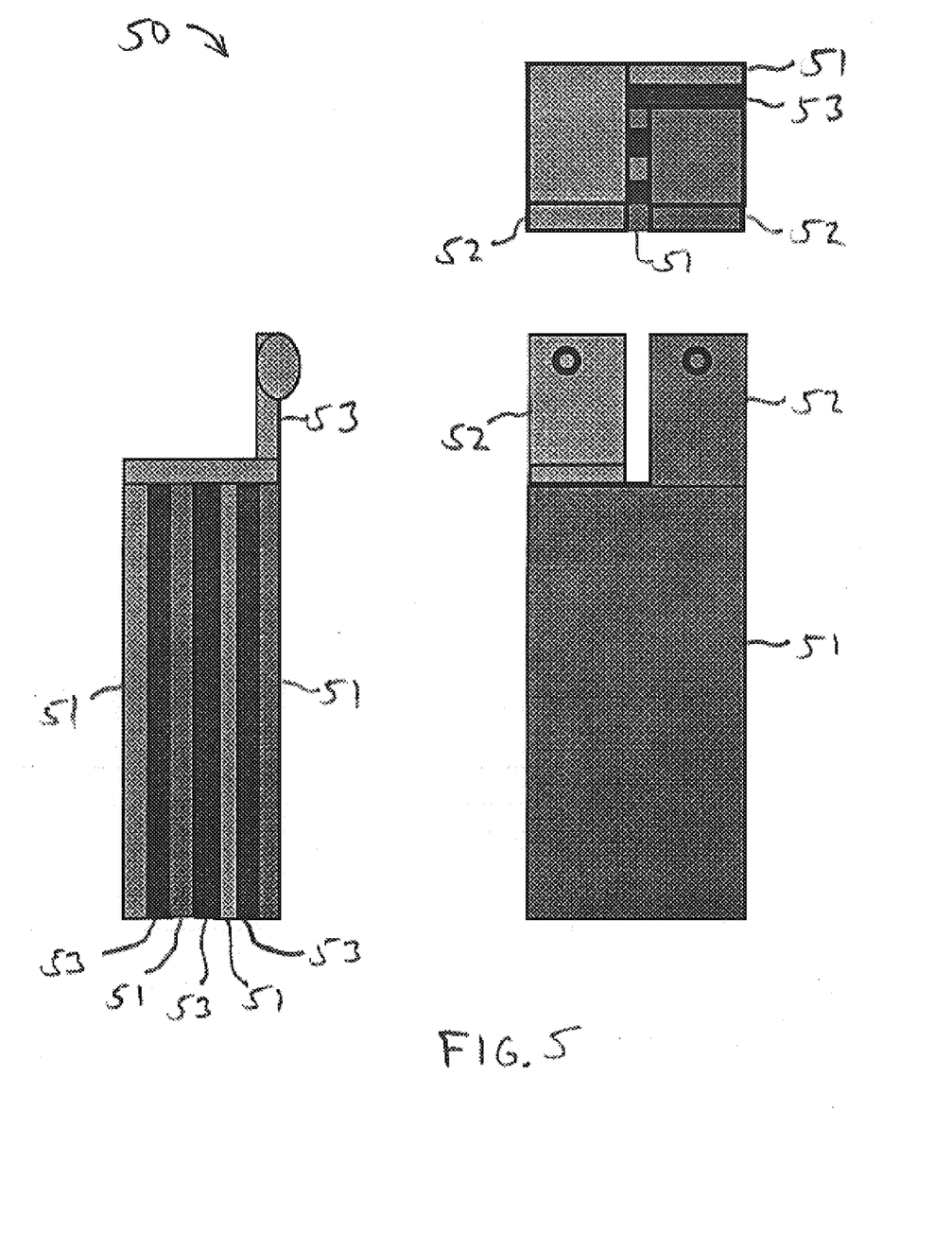
FIG. 5 shows three orthogonal views of a multi-layer, low inductance side contact assembly.

FIG. 5 shows three orthogonal views of a side contact assembly 50 according to another embodiment of the invention. In the embodiment of FIG. 5, each conductive member includes a flexible portion 52 with multiple rigid portion layers 51, providing multiple parallel current paths for each contact. The multiple parallel current paths further increase the mutual inductance between the contacts for power and ground, lowering the overall inductance. A dielectric layer 53 is sandwiched between each adjacent pair of rigid portions 51.

FIGS. 6 through 9 each show three orthogonal views for different embodiments of a side contact assembly advantageous for high-speed I/O applications. These high-speed embodiments include a reference plane 61 for a differential pair. The reference plane 61 provides for improved signal integrity from the side of the package to the circuit board. By using the side contacts with the reference plane, fewer pins are needed on the package to reduce the signal-to-reference ratio, and similarly, fewer plated through hole (PTH) vias are needed through the package. Therefore, a smaller package with fewer pins may be used for a given I/O count.

Figure 6:
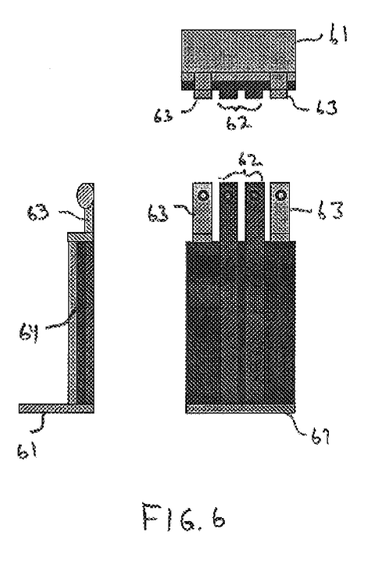
FIGS. 6 through 9 show embodiments of a side contact assembly for high-speed I/O applications.
Figure 7:
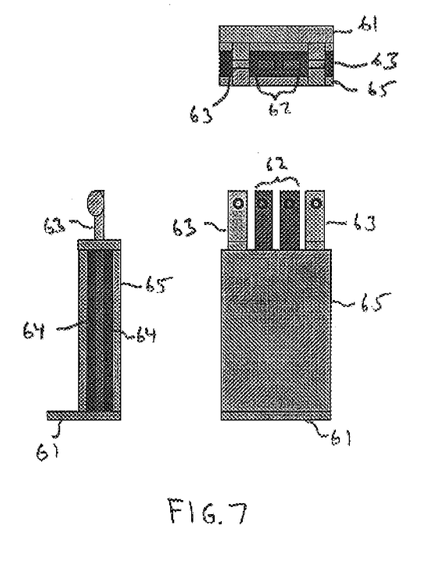
Figure 8:
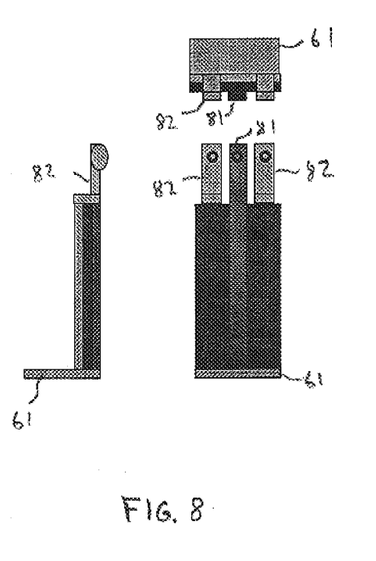
Figure 9:
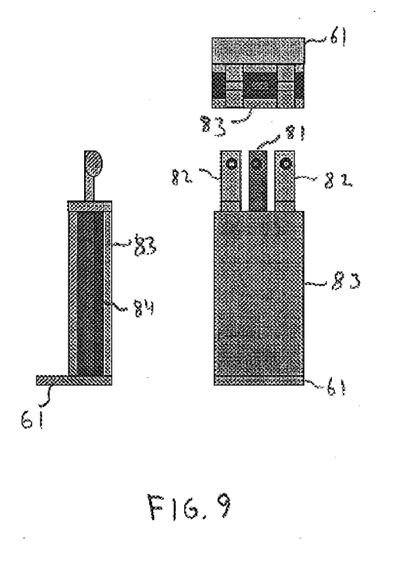

Referring to FIG. 6, the two middle contacts 62 (referring to the flexible portions of the conductive members) may be used for signal while the two outer contacts 63 are used for reference. A dielectric layer 64 is sandwiched between the signal and reference contacts. FIG. 7 shows an embodiment similar to FIG. 6, except that it includes an additional rigid portion 65 of the reference contact and an additional dielectric layer 64. This embodiment is thought to provide improved noise immunity. FIG. 8 shows another embodiment, in which one signal contact 81 is disposed between two reference contacts 82. By providing two reference contacts for each signal contact, the signal-to-reference ratio is further improved. FIG. 9 shows an embodiment similar to FIG. 8, except that it includes an additional rigid portion 83 of the reference contact and additional dielectric layer 84.

Note that a side contact assembly does not have to exclusively contain contacts for providing power or exclusively contain contacts for a differential signal pair. Rather, a single side contact assembly can combine aspects of the embodiments described above. For example, a single side contact assembly can include one or more power contacts, contacts for one or more differential pairs, and one or more single-ended I/O contacts, or any combination of these types of contacts. Similarly, rather than requiring several side contact assemblies to be arranged next to each other on a circuit board as shown in FIGS. 4A and 4B, a single, larger side contact assembly could be used, which might extend the entire length of a side of the device package or even completely surround the package.

Thus, a socket with low inductance side contacts has been described. Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

What is claimed is:

1. An electrical contact assembly comprising:
   a plurality of electrically conductive members, each including a first portion and a second portion extending from the first portion, the first portions of the electrically conductive members being arranged as at least one pair of conductive first portions stacked along a first axis, the second portions distributed along a second axis perpendicular to the first axis; and
   a set of dielectric layers including at least one dielectric layer, each dielectric layer sandwiched between an adjacent pair of the conductive first portions.

2. An electrical contact assembly as recited in claim 1, wherein the electrical contact assembly is coupled to a socket designed to receive a package of a die embodying a microelectronic device.

3. An electrical contact assembly as recited in claim 2, wherein the electrical contact assembly is to shunt current between a package of a microelectronic device and the socket, outside the package, when the microelectronic device operates.

4. An electrical contact assembly as recited in claim 1, wherein the electrical contact assembly is coupled to an outer surface of the socket.

5. An electrical contact assembly as recited in claim 1, further comprising a reference plane coupled to at least one of the conductive members at an end distal from the second portions of the conductive members.

6. An apparatus comprising:
 a socket to receive a package of a microelectronic device; and
 a contact assembly proximate to the socket, the contact assembly including a pair of electrically conductive members disposed adjacent to each other, each electrically conductive member including a flexible portion and a rigid portion, the flexible portion of each electrically conductive member positioned to be in contact with a separate corresponding electrical conductor on an outer surface of the package when the package is coupled to the socket, the rigid portions of the conductive members being arranged as at least one adjacent pair of rigid conductive portion the contact assembly further including a dielectric layer sandwiched between the adjacent pair of rigid conductive portions of the electrically conductive members.

7. An apparatus as recited in claim 6, wherein the contact assembly is coupled to the socket.

8. An apparatus as recited in claim 6, wherein the contact assembly is mounted to an outer surface of the socket.

9. An apparatus as recited in claim 8, wherein the contact assembly is to shunt current between the package and the socket, outside the package, when the microelectronic device operates.

10. An apparatus as recited in claim 6, further comprising a reference plane coupled to at least one of the conductive members.

11. An apparatus comprising:
 a socket to receive a package of a microelectronic device; and
 an electrical contact assembly coupled to the socket, the contact assembly including a plurality of electrically conductive members disposed adjacent to each other, each of the conductive members including a rigid portions and a flexible portion, the flexible portion of each of conductive member positioned to be in contact with a corresponding electrical conductor on an outer surface of the package when the package is coupled to the socket, the rigid portions of the conductive members being arranged as at least one adjacent pair of rigid conductive portion contact assembly further including a dielectric layer sandwiched between each two adjacent rigid conductive portions of the conductive members.

12. An apparatus as recited in claim 11, wherein the plurality of electrically conductive members includes at least one adjacent pair of electrically conductive members to conduct current in opposite directions.

13. An apparatus as recited in claim 11, wherein one conductor of said at least one adjacent pair of the electrically conductive members is a power contact and the other conductor of the pair is a ground contact, the electrical contact assembly to shunt current outside the package when the microelectronic device operates.

14. An apparatus as recited in claim 11, wherein one conductor of said at least one adjacent pair of the electrically conductive members is a signal contact and the other conductor of the pair is a reference contact.

15. An apparatus as recited in claim 14, the contact assembly further comprising a reference plane coupled to at least one of the conductive members at an end distal from the flexible portions of the conductive members.

16. A system comprising:
 a circuit board;
 a socket coupled to the circuit board to receive a package of a die, the die embodying a microelectronic device; and
 a contact assembly coupled to an outer edge of the socket, the contact assembly including a plurality of electrically conductive members disposed adjacent to each other, each of the conductive members including a rigid portion and a flexible portion that projects from the rigid portion, the flexible portion of each conductive member positioned to be in physical contact with a corresponding electrical conductor on an outer surface of the package when the package is coupled to the socket, at least one adjacent pair of the electrically conductive members to conduct current in opposite directions, the contact assembly further including a dielectric layer sandwiched between each two adjacent rigid portions of the conductive members.

17. An apparatus as recited in claim 16, wherein one conductor of said at least one adjacent pair of the electrically conductive members is a power contact and the other conductor of the pair is a ground contact, the contact assembly to shunt current outside the package between the microelectronic device and the circuit board when the microelectronic device operates.

18. An apparatus as recited in claim 16, wherein one conductor of said at least one adjacent pair of the electrically conductive members is a signal contact and the other conductor of the pair is a reference contact.

19. An apparatus as recited in claim 16, the contact assembly further comprising a reference plane coupled to at least one of the conductive members at an end distal from the flexible portions of the conductive members.

20. An apparatus as recited in claim 19, wherein the flexible portions of the conductive members comprise a first flexible portion disposed between, and adjacent to, second and third flexible portions of the conductive members along an axis, wherein said second and third flexible portions are coupled to the reference plane through their respective rigid portions, and wherein the first flexible portion is not coupled to the reference plane.

21. An apparatus as recited in claim 19, wherein the flexible portions of the conductive members comprise a first plurality of flexible portions and a second plurality of flexible portions disposed between, and adjacent to, the first plurality of flexible portions along an axis, wherein the first plurality of flexible portions are coupled to the reference plane through their respective rigid portions, and wherein the second plurality of flexible portions are not coupled to the reference plane.

22. An electrical contact assembly as recited in claim 1, wherein the second portions are distributed along a first horizontal axis, and the first portions are stacked along a second horizontal axis perpendicular to the first horizontal axis.

23. An electrical contact assembly as recited in claim 2, wherein the dielectric layer is co-extensive with the first portions of the adjacent pair of the electrically conductive members.

24. An apparatus as recited in claim 6, wherein the flexible portions are distributed along a first horizontal axis parallel to an edge of the socket, and the rigid portions are stacked along a second horizontal axis perpendicular to the first horizontal axis.

25. An apparatus as recited in claim 6, wherein the dielectric layer is co-extensive with the rigid portions of the pair of electrically conductive members.

26. An apparatus comprising:

a socket to receive a package of a microelectronic device; and a contact assembly proximate to the socket, the contact assembly including a plurality of electrical contacts disposed adjacent to each other, each of the electrical contacts including a rigid portion and a flexible portion that protrudes from the rigid portion, the flexible portions distributed along a first horizontal axis parallel to an edge of the socket, the rigid portions stacked along a second horizontal axis perpendicular to the first horizontal axis and being arranged as at least one pair of conductive rigid portions, each flexible portion positioned to be in contact with a separate corresponding electrical contact on an outer surface of the package when the package is coupled to the socket, the contact assembly further including at least one dielectric layer, each dielectric layer sandwiched between, and co-extensive with an adjacent pair of said rigid portions.

* * * * *

UNITED STATES PATENT AND TRADEMARK OFFICE
CERTIFICATE OF CORRECTION

PATENT NO. : 6,680,526 B2
DATED : January 20, 2004
INVENTOR(S) : Figueroa et al.

It is certified that error appears in the above-identified patent and that said Letters Patent is hereby corrected as shown below:

Column 5,
Line 23, delete "one" and insert -- an --.
Lines 24 and 52, delete "portion" and insert -- portions --.

Signed and Sealed this

Twenty-second Day of June, 2004

JON W. DUDAS
*Acting Director of the United States Patent and Trademark Office*